United States Patent [19]
Caule

[11] 3,837,929
[45] Sept. 24, 1974

[54] METHOD OF PRODUCING TARNISH RESISTANT COPPER AND COPPER ALLOYS AND PRODUCTS THEREOF

[75] Inventor: Elmer J. Caule, New Haven, Conn.

[73] Assignee: Olin Corporation, New Haven, Conn.

[22] Filed: Oct. 6, 1972

[21] Appl. No.: 295,685

Related U.S. Application Data

[60] Division of Ser. No. 67,943, Aug. 28, 1970, Pat. No. 3,716,427, which is a continuation-in-part of Ser. No. 59,684, July 30, 1970, Pat. No. 3,677,828.

[52] U.S. Cl. .................................... 148/6.16, 156/3
[51] Int. Cl. ............................ C23f 7/12, C23f 7/26
[58] Field of Search ............... 148/6.15, 6.16; 156/3

[56] References Cited

FOREIGN PATENTS OR APPLICATIONS 1,965 11/1963 Japan ................................ 148/6.16
625,065 6/1949 Great Britain .................... 148/6.16

OTHER PUBLICATIONS

Burns, Protective Coatings for Metals, Reinhold Publishing Corp., N.Y., 1955, pp. 22 and 32.

*Primary Examiner*—Ralph S. Kendall
*Assistant Examiner*—Bruce H. Hess
*Attorney, Agent, or Firm*—David A. Jackson

[57] ABSTRACT

A method of producing a laminate having high bond strength and excellent resistance to acid undercutting comprising applying a phosphoric acid solution to copper or its alloys containing a dichromate, rinsing, drying and adhesively laminating to a plastic film. The instant case also teaches a method of producing a high tarnish resistant copper and copper alloy by so treating, as well as a flexible printed circuit characterized by high bond strength and the absence of acid undercutting.

10 Claims, 1 Drawing Figure

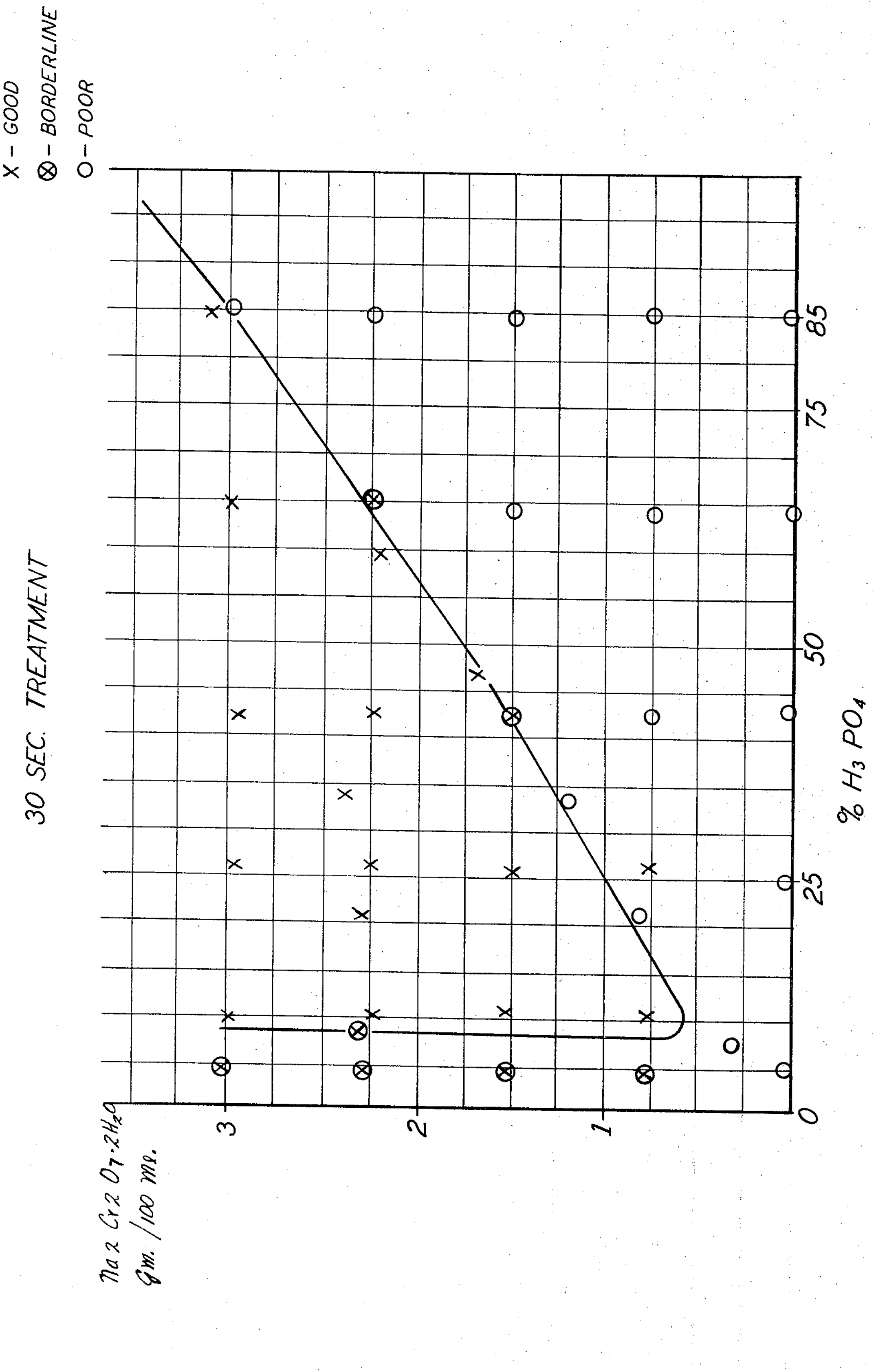
30 SEC. TREATMENT
X - GOOD
⊗ - BORDERLINE
O - POOR
0
25
50
75
85
% H3 PO4
1
2
3
Na2 Cr2 O7·2H2O
Gm./100 ml.

METHOD OF PRODUCING TARNISH RESISTANT COPPER AND COPPER ALLOYS AND PRODUCTS THEREOF

CROSS-REFERENCE TO RELATED APPLICATIONS

This application is a divisional of copending application Ser. No. 67,943, filed Aug. 28, 1970, now U.S. Pat. No. 3,716,427, which in turn is a continuation-in-part of application Ser. No. 59,684, filed July 30, 1970 now U.S. Pat. No. 3,677,828.

BACKGROUND OF THE INVENTION

The present invention relates specifically to metal plastic laminates having high bond strength and improved resistance to acid undercutting during manufacture of laminates into flexible printed circuits.

The present invention further broadly relates to treating copper and copper alloys to form a tarnish and oxidation resistant film thereon.

In the manufacture of flexible printed circuits copper foil or sheet is employed which normally has on its surface a film of an organic inhibitor, such as benzotriazole, in order to prolong the shelf life before manufacture of the circuit.

Flexible printed circuits comprise copper sheets or copper foil bonded to the surface of a plastic sheet, such as a polyester or polyimide. Normally two types of copper foil, either wrought annealed or electro deposited, are employed in the manufacture of flexible printed circuits.

Printed circuits find wide use in the electrical and electronic fields since they are advantageous in the elimination of individual lead wires which require a separate soldering or other joining operation to the various components of any particular circuit. The configuration of such a circuit facilitates the positioning of conventional circuit components such as capacitors, etc., and the soldering of these components to the wiring by a dipping operation.

The manufacture of flexible printed circuits comprises adhesively bonding copper sheet or foil to a plastic film, such as a polyester or polyimide, and generally employing a suitable glue. As one preferred way the copper side of the resultant laminate is then sprayed with a photo resist and the required circuit is projected onto the coated side of the copper component which transforms the photo resist into an acid insoluble compound in a figure and likeness of the circuit. The laminate is then immersed or sprayed with an acid etchant, such as a ferric chloride solution, to dissolve away the unwanted portion of the copper, i.e., that portion of the copper component of the laminate which is not part of the required circuitry.

Various problems arise however in the present manufacture of flexible printed circuits to which the present invention is directed.

For example, in order to provide tarnish resistance of rolled copper and an acceptable laminated product, before laminating a film of an organic inhibitor is normally applied to the surface of the copper.

The organic inhibitor, e.g., benzotriazole, provides for long shelf life or stability during storage.

Before laminating of a wrought hard copper to the plastic film it is advantageous to anneal the copper in order to provide increased ductility which is highly desirable in flexible printed circuits. It has been found that the organic inhibitor upon the copper surface decomposes during the annealing. Due to this decomposition problems arise such as the effect of the benzotriazole is no longer apparent and therefore the product no longer has good shelf life and tarnishing occurs. The tarnishing causes both poor laminate bond strength, uneven acid etching, and rapid acid undercutting along the bonded interface during etching away of the unwanted copper portion of the laminate. The acid undercutting generally occurs at a rate equivalent to at least 30 mils per hour from each side of the copper circuitry, at the aforementioned interface, and materially degrades the quality of the printed circuit.

Therefore, unless the copper foil-plastic laminate exhibits poor bond strength when room temperature oxidation or tarnishing occurs on the foil. Furthermore, the resistance to acid undercutting along the interface of the wrought annealed foil is poor as aforementioned. A further complication with wrought annealed and other foil arises with the use of organic inhibitors such as benzotriazole, since residual benzotriazole on the unbonded side of the foil results in uneven etching of the circuit because the benzotriazole provides some inhibition in the etching solution. A still further disadvantage with organic inhibitors occurs with certain plastic systems wherein high temperatures, i.e., above 240°F, are employed for curing of the glue. These high temperatures cause the copper-organic inhibiting film to decompose with the formation of relatively large amounts of gases which causes blistering of the laminate and thereby producing an unacceptable product.

It is well known, as aforementioned, that copper and many of its alloys possess low resistance to tarnishing in many atmospheres and particularly atmospheres containing industrial wastes such as compounds of sulfur. It is therefore required, in order to provide a measure of tarnish resistance for a relatively prolonged period of time, that a film of an organic inhibitor, such as benzotriazole, be applied to the surface of the copper or copper alloy.

The application of such inhibitors provides for prolonging the aesthetic appeal of copper materials in finished form, such as lamp bases and other consumer goods for the home, and also provides for long shelf life before further manufacture of such materials into final consumer articles. This is particularly important since prolonged exposure of copper materials in an industrial environment naturally degrades the exposed surfaces resulting in build up of corrosion products, such as copper oxides and sulfides, which may necessitate a severe mechanical or chemical cleaning operation in order to restore the material surfaces to a condition compatible for normal further cleaning and manufacturing operation, e.g., a simple alkaline clean or degreasing cycle before additional mechanical working of the material.

It is therefore a principle object of the present invention to provide a method for producing a copper, or copper alloy, sheet or foil adhesively bonded to a plastic film to form a laminate wherein the laminate is characterized by increased resistance to acid undercutting and uneven dissolution of the unwanted copper during manufacture of the laminate into a flexible circuit.

It is an additional object of the present invention to provide a method for providing increased tarnish resistance of copper and its alloys.

It is a further object to provide a method for producing a flexible printed circuit which is characterized by no substantial undercutting of the circuitry and by high bond or peel strength and tarnish resistance without degradation of other properties so desirable in flexible printed circuitry.

It is still a further object of the present invention to provide the objects as aforesaid conveniently, expeditiously and inexpensively.

Further objects and advantages of the present invention will become apparent hereinafter.

SUMMARY OF THE INVENTION

The present invention comprises applying a phosphoric acid solution containing from about 3.5 grams per liter up to the solubility limit of sodium dichromate or potassium dichromate to a surface of copper sheet or foil for at least 2 seconds to form a tarnish resistant film, rinsing and drying the foil or sheet, and then adhesively bonding the treated foil or sheet to a plastic film to form a laminate.

The present invention also provides for further forming of the laminate into a flexible printed circuit. A preferred method of forming of the flexible printed circuit is by applying a photo-resist to the surface of the aforementioned foil or sheet opposing the surface bonded to the plastic film, projecting the desired circuitry upon the photo resist to form an acid insoluble compound in the area of the required circuitry, dissolving away the unwanted copper in an acidic solution and then rinsing and drying.

The present invention additionally provides for highly tarnish resistant copper or alloy thereof having on its surface a glassy like and substantially pore free film of copper phosphate from 20 to 1,000 Angstrom units thick. When the aforementioned copper or copper alloy is adhesively bonded to a plastic film as, for example, in the form of a flexible printed circuit, the printed circuit is characterized by stable high bond strength and substantially no acid undercutting of the copper circuitry in the bonded interface It is a particular advantage of the present invention that the treated wrought copper foil or sheet can be annealed prior to the aforementioned adhesively bonding step, which provides the advantage of high ductility of a wrought-annealed copper foil or sheet product.

It is to be noted that the present invention also broadly relates to highly tarnish resistant copper or an alloy thereof which possesses long shelf life and therefore materially reduces requisite cleaning of a fully manufactured and treated copper article as well as copper or copper alloy which requires further manufacturing or processing into finished articles, such as laminates and flexible printed circuits.

DETAILED DESCRIPTION OF THE INVENTION

The tarnish resistant coating is obtained by applying a phosphoric acid solution containing from about 3.5 grams per liter up to the solubility limit of sodium dichromate ($Na_2Cr_2O_7 \cdot 2H_2O$) or potassium dichromate ($K_2Cr_2O_7$) or mixtures thereof to the copper sheet or foil. Normally, the application of the aforementioned solution is by immersion of the sheet or foil in a bath.

The acid normally employed is from about 8 to 85 percent phosphoric acid having the formula $H_3PO_4$, and most normally concentrated, although a solution of phosphates such as acid solutions of sodium ($Na_2HPO_4$), potassium ($K_2HPO_4$), and lithium ($LiH_2PO_4$) may also be readily employed in a concentration range normally corresponding to about 8 percent of phosphoric acid of the formula $H_3PO_4$ up to their solubility limits of water.

In general as the concentration of the aforementioned sodium or potassium dichromate is increased the concentration of phosphoric acid ($H_3PO_4$) and of the aforementioned phosphates is proportionately increased, and normally at a constant rate.

The temperature of the acid solution is generally ambient for practical considerations but may range from below that of room up to substantially the boiling point. The aforementioned solution may also be suitably agitated, if desired, by conventional mechanical means.

Following the aforementioned immersion step the copper sheet or foil is rinsed and dried. The rinsing is normally carried out in running water although a spray rinse may also be readily employed. Drying is accomplished by an air blast, rinsing in an alcohol solution such as methanol and allowing to dry, or merely by allowing to dry by exposure to the atmosphere.

Following rinsing and drying the treated surface of the copper sheet or foil is adhesively bonded to a plastic film, such as by employing a high temperature glue in order to form a laminate.

In this embodiment the resultant laminate comprising copper sheet or foil and a plastic film is particularly useful in the manufacture of flexible printed circuitry. Although not critical the preferred plastic film comprises a polyester or polyimide organic compound, and in particular Mylar and Kapton, respectively.

Preferably but not necessarily, before the aforementioned bonding the copper foil or sheet is recrystallized annealed in a reducing atmosphere at a temperature from about 250° to 500°F for at least about 8 minutes, and preferably not longer than about 16 hours when at a temperature of about 250° to 350°F, and preferably not longer than about one-half hour when at a temperature in the aforementioned range in excess of about 350°F.

A further embodiment is the applying of a photo resist to the unbonded surface of the copper component of the aforementioned laminate and then conventionally impressing a pattern of the required circuitry which transforms the photo resist to an acid insoluble compound at the area of the impressed circuitry.

The unwanted copper is then dissolved away by a suitable acid such as ferric choride, in those areas of the laminate broad wherein the photo resist has not been transformed into an acid insoluble compound during projection of the circuitry. The laminate is then rinsed and dried and thereby a completed flexible circuit is formed.

The copper provided in forming the flexible printed circuit of the present invention is normally from about 0.25 to 6 mils in thickness and is in the annealed condition and may be any suitable copper or alloy thereof which is capable of carrying the required current for the intended application. Normally CDA Alloy 110 (99.90 percent minimum copper, 0.04 nominal oxygen) or CDA Alloy 102 (99.95 percent minimum copper) is employed. Naturally, it is also preferred that the sheet or foil be suitably cleaned before treatment.

Preferably, but not necessarily, the surface of the copper which is to be bonded to the plastic film is roughened before the aforementioned treatment, and preferably such as to provide a surface having an average roughness peak of about 1 to 40 micro inches RMS. Any suitable method of roughening may be employed such as, for example, pack rolling, rolling with suitably roughened rolls, or abrasive blasting.

It has been surprisingly found that the present invention provides for a high quality circuit laminates wherein acid under-cutting of the copper circuitry is reduced to an acceptable level and frequently to nil.

The circuit laminate of the present invention is also characterized by having high bond strength as a result of the aforementioned treatment, as well as substantially no acid undercutting of the circuitry at the bonded interface, i.e., at each side of the circuitry where the circuitry is adhesively bonded to the plastic film. The good bond strength and acid undercutting resistance are not degraded by long time exposure to the atmosphere.

The circuit as well as the laminate and copper or copper alloy, of the present invention is further characterized by having uniformly thereon a glassy like, and pore free coppper phosphate coating of a thickness of from about 20 to 1,000 Angstrom units and readily overcomes the aforementioned disadvantages of high acid undercutting and of low bond strength as well as other disadvantages of the prior art.

For example, in the manufacture of flexible printed circuits electrodeposited copper foil is frequently employed in place of wrought annealed copper wherein one side, or surface, of the foil is relatively rough. Such rough surface is oxidized and then both sides of the electrodeposited copper foil are treated with the aforementioned benzatriazole inhibitor. The inhibitor forms a copper salt when it reacts with the copper oxide present on both sides of the foil, intentionally on the rough side and as a residual on the other or smooth side. This residual benzotriazole salt on the smooth side causes uneven etching response of the copper foil plastic laminate.

Electrodeposited copper is also disadvantageous when bonded to a polyester film since the foil is generally of low ductility whereas a relatively high ductile material, such as rolled and annealed copper, is desirable in flexible printed circuitry wherein a polyester film, such as Mylar, or a polyimide film, such as Kapton, is employed.

Furthermore, electrodeposited copper does not tend to uniformly etch away in the unwanted areas of the copper component during formation of the circuitry due to its relatively large grain size; whereas the more uniform, and fine grain size of rolled and annealed copper tends to provide for more even etching which is preferred in the forming of high quality circuitry.

Electrodeposited copper inhibited by benzotriazole is also disadvantageous when bonding to a polyimide plastic film since the polyimide films, such as Kapton, require a curing temperature which is sufficiently high to promote degragation of the copper-benzotriazole salt thereby degrading or destroying the laminate. Therefore rolled copper foil is used with the polyimides rather than electrodeposited copper.

It is also noted that the flexible circuit of the present invention may readily be soft soldered over the aforementioned film thus providing for increased economy in assembling of composite electrical circuitry.

It is further noted that as a result of the aforementioned application of the dichromate containing phosphoric acid solution that copper and its alloys have very high tarnish resistance and therefore long shelf life prior to laminating as well as prolonged aesthetic value since the normal corrosion products produced in both clear and polluted atmospheres are reduced.

In addition the method of the present invention of forming a tarnish resistant film on copper and its alloys has also been surprisingly found to prevent sticking together of the metal sheets during annealing, which thus overcomes a prevalent problem during mill processing.

The present invention will become more readily apparent from the following illustrative examples.

EXAMPLE I

The present example describes the method of laminating and testing of samples for peel strength and acid undercutting when laminating to a polyester.

CDA copper 110 foil was degreased by swabbing with benzene. It was then brought into contact with a Mylar sheet 3/1,000 inch thick covered with 1/10 inch of 1/1,000 inch thermo plastic glue and heat and pressure were supplied to effect a bond between the glue and the metal. From the sheet so manufactured, strips 1 cm. wide and 10 cm. long were cut for testing of the bonding strength between plastic and metal and squares 2 cm. on a side were cut for testing the resistance of the bond to undercutting by dilute hydrochloric acid. The bonding strength, or "peel" strength, was measured by attaching the plastic by means of doubled sided adhesive tape to the rim of a freely-pivoted wheel of radius 6 inches and thickness 1 inch, then slightly freeing a short section of the metal from the plastic attaching the free end of the metal to a spring balance and then pulling the metal radially from the wheel while simultaneously reading the balance; this arrangement insures that the metal will separate perpendicularly from the plastic.

The undercutting test was performed by immersing the square of laminate in 10 percent hydrochloric acid in water for definite periods of time conventionally taken here as 1 hour and at the end of that time reading the width of the separation of plastic from metal by means for magnifying eyeglass fitted with a ruled grating to enable lengths to be measured to an accuracy of 1/1,000 inch. The peel strength is reported as the force of separation in pounds per inch of width which requires the experimental results obtained as above to be multiplied by 2.54 and the rate of undercutting is reported as thousandths of inches per hour.

EXAMPLE II

As a comparative example to the present invention smooth annealed CDA copper 110 which had, before annealing, been cold rolled to a thickness such that 1 square foot of the copper foil weighed 1 oz., was laminated to a polyester (Mylar) film 3/1,000 inch thick by means of a thermo plastic glue. Before lamination the copper foil had been degreased by swabbing with benzene of reagent grade. The peel strength was determined to be 8.8 lbs./inch and the acid undercutting rate was 150/1,000 inch per hr.

EXAMPLE III

As a comparative example to the present invention smooth annealed CDA copper 110, cold rolled before annealing to a weight of 1 oz./sq.ft., was degreased with benzene of reagent grade and let stay in the open air for 3 days indoors. At the end of that time it was laminated to Mylar 3/1,000 inch thick and tested for peel strength and for rate of undercutting. The peel strength was 2 lbs./in. and the undercutting rate was 150/1,000 inch per hr.

EXAMPLE IV

The present comparative example illustrates the effect of roughening and of immediate laminating wherein a tarnish film has not had a chance to form.

Annealed CDA copper 110 which before annealing had been cold rolled to a thickness corresponding to a weight of 1 oz./sq.ft., was roughened to a roughness of 20 micro inches RMS value as determined by a stylus instrument. This copper was immediately laminated to a polyester film (Mylar) 3/1,000 inch thick with a thermo plastic glue. The bond strength was determined to be 7 lbs./inch and the rate of undercutting was determined to be 0/1,000 inch per hr.

EXAMPLE V

As a comparative example to the present invention annealed CDA copper 110 which before annealing had been cold rolled to a thickness corresponding to a weight of 1 oz./sq. ft., was roughened to a roughness of 20 micro inches RMS value as determined by a stylus instrument. This copper was stored in a covered dish in laboratory air for 3 days. At the end of that time it was laminated to Mylar 3/1,000 inch thick and samples were cut and tested for bond strength and for rate of undercutting. The bond strength was determined to 3 lbs./inch and the rate of undercutting was determined to be 80/1,000 inch per hr.

EXAMPLE VI

The present invention is illustrative of the present invention. Annealed CDA copper 110 which before annealing had been cold rolled to a thickness corresponding to a weight of 1 oz./sq.ft., was roughened to a roughness of 20 micro inches RMS value as determined by a stylus instrument. The foil was then immersed in a solution containing phosphoric acid at a strength of 85 percent and sodium dichromate at a concentration of 4 oz./gal. The time of immersion was 30 seconds. After rinsing in cold water and drying, the foil was annealed at 250°C in a 4 percent hydrogen–96 percent nitrogen gas mixture for 2 hours. After cooling the foil was immediately laminated to a polyester film (Mylar) 3/1,000 inch thick covered with a thermo plastic glue. Specimens were cut from the laminate and tested for bond strength and rate of acid undercutting. The bond strength was determined to be 5 lbs./inch and the rate of undercutting was found to be 2/1,000 inch per hr.

EXAMPLE VII

The present example is illustrative of the present invention.

Annealed CDA copper 110 which before annealing had been cold rolled to a thickness corresponding to a weight of 1 oz./sq. ft., was roughened to a roughness of 20 micro inches RMS value as determined by a stylus instrument. The foil was then immersed in a solution containing phosphoric acid at a strength of 85 percent and sodium dichromate at a concentration of 4 oz./gal. The time of immersion was 30 seconds. After rinsing in cold water and drying, the foil was annealed at 250°C in a 4 percent hydrogen–96 percent nitrogen gas mixture for 2 hours. After cooling the foil was stored for 2 weeks in a covered vessel in laboratory air. At the end of that time it was laminated to a polyester (Mylar) film covered with a thermo plastic glue. Specimens were cut and tested for bond strength and rate of acid undercutting. The bond strength was found to 4.6 lbs./inch and the rate of undercutting was measured as 3/1,000 inch per hr.

EXAMPLE VIII

The present example illustrates the method of laminating and testing for peel strength and acid undercutting when bonding to a polyimide.

CDA copper 110 foil was degreased by swabbing with benzene. It was then brought into contact with a plastic film made of polyimide plastic with a cast glue ½ 1,000 inch on its surface. The metal and the plastic were passed together through heated rollers at a temperature of 200°F with a moderate pressure sufficient to lightly attach the 2 sheets together. The sandwich assembly was then placed in a platen press heated to 330°F at a pressure of about 12 lbs./sq. inch for a period of 30 minutes. From this cured assembly strips suitable for testing were cut and tests were conducted to determine bond strength and rate of undercutting. The results were reported in the same units as were the results obtained with the Mylar film.

EXAMPLE IX

As a comparative example to the present invention smooth annealed CDA copper 110 foil in a 1 oz. weight was degreased with benzene and laminated to polyimide film (Kapton) in a platen press. Determination of the bond strength gave the figure 2.9 lbs./inch and the rate of undercutting was found to be 50/1,000 inch per hr.

EXAMPLE X

As a comparative example to the present invention smooth annealed CDA copper 110 sheet, which before annealing had been cold rolled to a weight of 1 oz./sq. ft., was degreased and exposed to laboratory air in a covered container for 3 days. At the end of that time it was laminated to a polyimide (Kapton) and samples were cut and both bond strength and acid undercutting rate were determined. The bond strength was 1.2 lbs./inch and the rate of undercutting 150/1,000 inch per hr.

EXAMPLE XI

The present example illustrates the effect of roughening and immediate laminating wherein a tarnish film has not had a chance to form.

Annealed CDA copper 110 foil, which before annealing had been cold rolled to a weight of 3 oz./sq. ft., was deliberately roughened by being passed through a set of rolls one of which had been rough ground. The surface roughness was determined by a stylus instrument to be 20 micro inches RMS. The roughened surface was immediately laminated to a sheet of polyimide (Kapton) plastic 0.003 inch thick covered with an adhesive. The bond strength was found to be 1.5 lbs./inch and the rate of undercutting was found to be 0/1,000 inch per hr.

EXAMPLE XII

As a comparative example to the present invention annealed CDA copper 110 foil, which before annealing had been cold rolled to a weight of 3 oz./sq. ft., was deliberately roughened by being passed through a set of rolls, one of which had been rough ground. The surface roughness was determined by a stylus instrument to be 20 micro inches RMS. The foil was stored in a covered dish in the laboratory air for 2 weeks. At the end of that time the roughness surface was laminated to a sheet of polyimide plastic (Kapton) and specimens were cut for testing. The bond strength was found to be 1.2 lbs./inch and the rate of undercutting was found to be 250/1,000 inch per hr.

EXAMPLE XIII

The present example is illustrative of the present invention.

Annealed CDA copper foil, which before annealing had been cold rolled to a weight of 3 oz./sq. ft., was deliberately roughened by being passed through a set of rolls, one of which had been rough ground. The surface roughness was determined by a stylus instrument to be 20 micro inches RMS. The copper foil was then immersed for 30 seconds in a solution containing phosphoric acid at 85 percent concentration and sodium dichromate at a concentration of 4 oz./gal. After immersion it was rinsed in cold water and dried and was then annealed in a 4 percent hydrogen–96 percent nitrogen gas atmosphere at 250°C for 2 hours. The resulting foil was immediately laminated to a polyimide film (Kapton) covered with a cast glue, and samples were cut and tested. The bond strength was found to be 4.6 lbs./inch and the rate of undercutting was 0/1,000 inch per hr.

EXAMPLE XIV

The present example is illustrative of the present invention.

Annealed CDA copper 110 foil, which before annealing had been cold rolled to a weight of 3 oz./sq ft., was deliberately roughened by being passed through a set of rolls, one of which had been rough ground. The surface roughness was determined by a stylus instrument to be 20 micro inches RMS. The copper foil was then immersed for 30 seconds in a solution containing phosphoric acid at 85 percent concentration and sodium dichromate at a concentration of 4 oz./gal. After immersion it was rinsed in cold water and dried and was then annealed in a 4 percent hydrogen–96 percent nitrogen gas atmosphere at 250°C for 2 hours. The foil was then stored in a covered vessel in laboratory air for 2 weeks. At the end of that time it was laminated to a polyimide film (Kapton) samples were cut and tested for bond strength and for rate of undercutting. The bond strength was found to be 4.2 lbs./inch and the rate of undercutting was found to be 0/1,000 inch per hr.

EXAMPLE XV

The accompanying figure illustrates the high tarnish resistance imparted to copper and its alloys, and the imparted high peel strength and high resistance to acid undercutting when laminated to a plastic film and formed into a printed circuit.

CDA copper 110 was degreased and dipped in a solution of varying concentrations of sodium dichromate and phosphoric acid ($H_3PO_4$) for 30 seconds and then rinsed in running water and dried. Coupons were then cut and tested by hanging over 5 ml. of concentrated ammonium sulfide solution in a 200 ml. beaker for 15 seconds. Depending on the concentration of dichromate and phosphoric acid, the specimens were either heavily tarnished as shown by temper color or were completely unaffected by the sulfide vapors. The figure attached shows the tarnishing behavior of the coupons as a function of position in a concentration diagram. It is clearly seen in the figure that the effective field of treatment is bounded on its lower side by a line passing nearly through zero and of slope such that as the concentration of $H_3PO_4$ is increased the lowest permissible dichromate concentration is proportionately increased. This diagram thus shows the field of formation of the protective film.

Thus, the present invention provides for a convenient and expeditious method for preparing copper sheet or foil having long shelf life, and for providing high bond strength and excellent resistance to acid undercutting in metal plastic laminates which is of great advantage in the preparation of flexible printed circuitry in the electric and electronic industries.

The present invention also provides a method for treating copper and its alloys which materially increases tarnish resistance, and shelf life, of these materials and thereby providing for prolonged aesthetic appeal and reducing or eliminating normally requisite chemical or mechanical cleaning operations.

This invention may be embodied in other forms or carried out in other ways without departing from the spirit or essential characteristics thereof. The present embodiment is therefore to be considered as in all respects illustrative and not restrictive the scope of the invention being indicated by the appended claims and all changes which come within the meaning and range of equivalency are intended to be embraced therein.

What is claimed is:

1. A method of producing a tarnish resistant film on copper and copper alloys, comprising:

A. providing a material selected from the group consisting of copper and copper alloys, B. applying to said material a phosphoric acid solution of at least 8 percent concentration and containing from 3.5 grams per liter up to the solubility limit of a material selected from the group consisting of sodium dichromate and potassium dichromate and mixtures thereof, for at least 2 seconds, to form a substantially pore free film of copper phosphate from 20 to 1,000 Angstroms thick, provided that when the concentration of phosphoric acid is increased, the minimum dichromate concentration is proportionately increased, C. rinsing said material, and D. drying said material.

2. A method according to claim 1 wherein when the concentration of phosphoric acid is increased the concentration of said dichromates and mixtures thereof is proportionately increased.

3. A method according to claim 1 wherein said material is copper in the form of foil or sheet.

4. A method according to claim 1 wherein said material is roughened before step B.

5. A method according to claim 1 wherein said phosphoric acid solution is 8 percent to concentrated phosphoric acid of the formula $H_3PO_4$.

6. A method according to claim 1 wherein said phosphoric acid solution is a sodium phosphate solution in a concentration range corresponding to 8 percent $H_3PO_4$ up to the solubility limit of sodium phosphate in water.

7. A method according to claim 1 wherein said phosphoric acid solution is a potassium phosphate solution in a concentration range corresponding to 8 percent $H_3PO_4$ up to the solubility limit of potassium phosphate in water.

8. A method according to claim 1 wherein said phosphoric acid solution is a lithium phosphate solution in a concentration range corresponding to 8 percent $H_3PO_4$ up to the solubility limit of lithium phosphate in water.

9. A method according to claim 1 wherein said phosphoric acid is concentrated.

10. A method according to claim 4 wherein said roughening is to an average roughness peak of about 1 to 40 micro inches.

* * * * *